(12) United States Patent
Tajima et al.

(10) Patent No.: US 12,469,698 B2
(45) Date of Patent: Nov. 11, 2025

(54) WAFER HAVING SILICON SUBSTRATE WITH SUPPRESSED FRACTURES, SEMICONDUCTOR DEVICE, AND METHOD FOR MANUFACTURING THE WAFER

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Jumpei Tajima, Mitaka (JP); Hajime Nago, Yokohama (JP); Toshiki Hikosaka, Kawasaki (JP); Shinya Nunoue, Ichikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 578 days.

(21) Appl. No.: 17/884,631

(22) Filed: Aug. 10, 2022

(65) Prior Publication Data

US 2023/0197444 A1 Jun. 22, 2023

(30) Foreign Application Priority Data

Dec. 20, 2021 (JP) ................. 2021-205644

(51) Int. Cl.
*H01L 21/02* (2006.01)
*H10D 30/01* (2025.01)
(Continued)

(52) U.S. Cl.
CPC ..... *H01L 21/02458* (2013.01); *H10D 30/015* (2025.01); *H10D 30/475* (2025.01); *H10D 62/8503* (2025.01)

(58) Field of Classification Search
CPC ........... H01L 21/0254; H01L 21/02458; H01L 21/02505; H01L 21/02507;
(Continued)

(56) References Cited

U.S. PATENT DOCUMENTS 5,302,232 A * 4/1994 Ebe ..................... H01L 21/0262
257/190
2012/0273759 A1* 11/2012 Ikuta .................... H10D 10/891
257/E29.105
(Continued)

FOREIGN PATENT DOCUMENTS

JP 2011-216579 A 10/2011
JP 6205497 B2 9/2017
(Continued)

*Primary Examiner* — Sonya McCall-Shepard
(74) *Attorney, Agent, or Firm* — Oblon, McClelland, Maier & Neustadt, L.L.P.

(57) ABSTRACT

According to one embodiment, a wafer includes a silicon substrate including a first surface, and a nitride semiconductor layer provided on the first surface. The silicon substrate includes a plurality of first regions that can be distinguished from each other in an X-ray image of the wafer. The first regions are separated from an outer edge region of the silicon substrate. One of the first regions includes a plurality of first linear bodies along a first line direction. An other one of the first regions includes a plurality of second linear bodies along a second line direction. The second line direction crosses the first line direction.

14 Claims, 8 Drawing Sheets

(51) Int. Cl.
_H10D 30/47_ (2025.01)
_H10D 62/10_ (2025.01)
_H10D 62/815_ (2025.01)
_H10D 62/85_ (2025.01)
_H10D 62/854_ (2025.01)
_H10D 64/23_ (2025.01)
_H10D 64/27_ (2025.01)

(58) Field of Classification Search
CPC ......... H01L 21/02381; H01L 21/02579; H01L 21/02502; H10D 62/8503; H10D 10/891; H10D 30/015; H10D 30/475; H10D 62/8164; H10D 64/256; H10D 64/513; H10D 62/117; H10D 62/124; H10D 62/854; H10D 62/40–57
See application file for complete search history.

(56) References Cited

U.S. PATENT DOCUMENTS

| | | | |
|---|---|---|---|
| 2015/0357418 A1* | 12/2015 | Lee | H01L 21/02507 257/76 |
| 2017/0256635 A1 | 9/2017 | Ogawa et al. | |
| 2022/0069090 A1 | 3/2022 | Suzuki et al. | |

FOREIGN PATENT DOCUMENTS

| | | |
|---|---|---|
| JP | 2019-003963 A | 1/2019 |
| JP | 2020-113693 A | 7/2020 |

* cited by examiner

WAFER HAVING SILICON SUBSTRATE WITH SUPPRESSED FRACTURES, SEMICONDUCTOR DEVICE, AND METHOD FOR MANUFACTURING THE WAFER

CROSS-REFERENCE TO RELATED APPLICATIONS

This application is based upon and claims the benefit of priority from Japanese Patent Application No. 2021-205644, filed on Dec. 20, 2021; the entire contents of which are incorporated herein by reference.

FIELD

Embodiments described herein relate generally to a wafer, a semiconductor device, and a method for manufacturing the wafer.

BACKGROUND

For example, a semiconductor device is manufactured using a wafer including a nitride semiconductor. Wafers capable of high productivity are desired.

DETAILED DESCRIPTION

Figure 1A:
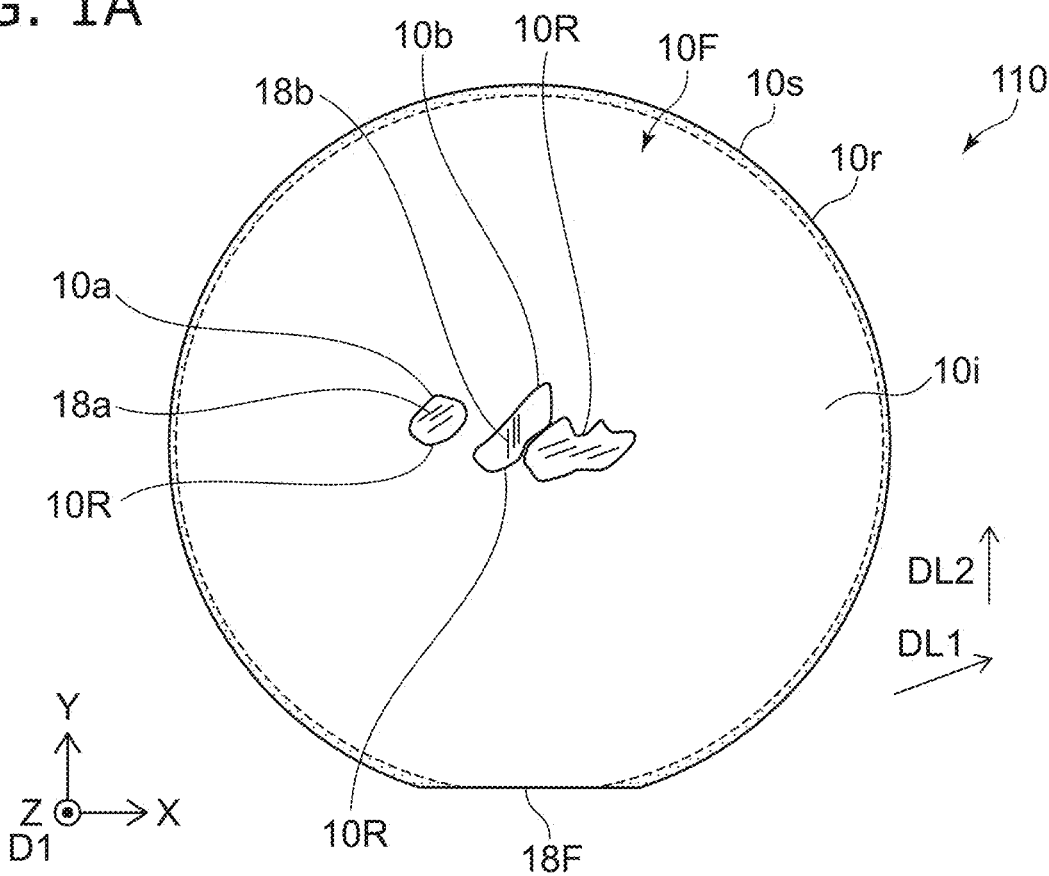
FIGS. 1A and 1B are schematic views illustrating a wafer according to a first embodiment.

According to one embodiment, a wafer includes a silicon substrate including a first surface, and a nitride semiconductor layer provided on the first surface. The silicon substrate includes a plurality of first regions that can be distinguished from each other in an X-ray image of the wafer. The first regions are separated from an outer edge region of the silicon substrate. One of the first regions includes a plurality of first linear bodies along a first line direction. An other one of the first regions includes a plurality of second linear bodies along a second line direction. The second line direction crosses the first line direction.

According to one embodiment, a semiconductor device is manufactured of the wafer described above.

According to one embodiment, a method for manufacturing a wafer is disclosed. The method can includes forming a first nitride layer including $Al_{a1}Ga_{1-a1}N$ (0≤a1≤1) on a silicon substrate including a first surface, and forming a second nitride layer including $Al_{a2}Ga_{1-a2}N$ (0≤a2≤1) on the first nitride layer. In the forming the second nitride layer, the first surface is convexly aligned upward, and a temperature of an inner region including a center of the first surface in a first direction from the silicon substrate to the first nitride layer is higher than a temperature of an outer edge region around the inner region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
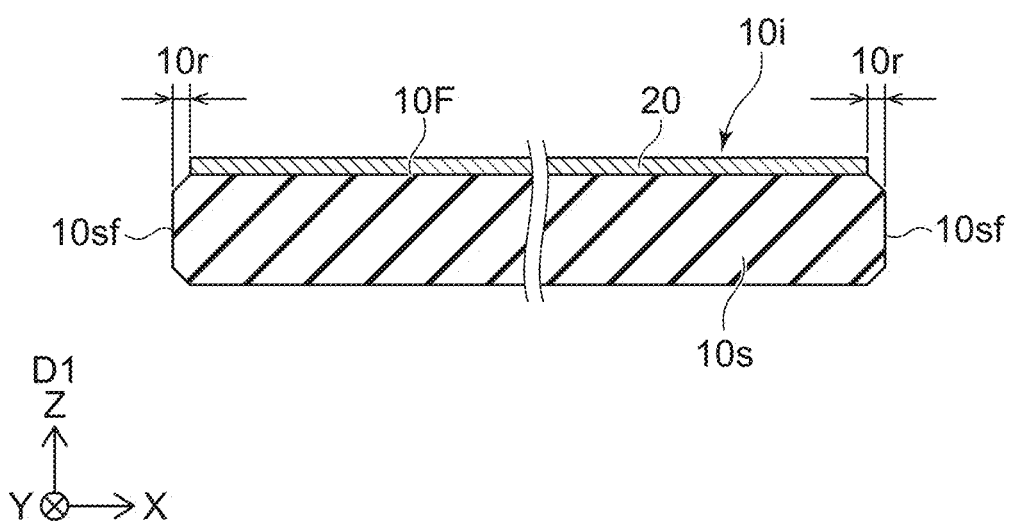

FIGS. 1A and 1B are schematic views illustrating a wafer according to a first embodiment.

FIG. 1A is a plan view. FIG. 1B is a cross-sectional view.

As shown in FIG. 1B, a wafer 110 according to the embodiment includes a silicon substrate 10s and a nitride semiconductor layer 20.

The silicon substrate 10s includes a first surface 10F. The first surface 10F is, for example, an upper surface. A direction perpendicular to the first surface 10F is defined as a first direction D1, and the first direction D1 is defined as a Z-axis direction. One direction perpendicular to the Z-axis direction is defined as an X-axis direction. A direction perpendicular to the Z-axis direction and the X-axis direction is defined as a Y-axis direction.

The nitride semiconductor layer 20 is provided on the first surface 10F. The silicon substrate 10s and the nitride semiconductor layer 20 are layered so as to spread substantially parallel to an X-Y plane. As shown in FIG. 1A, the silicon substrate 10s may include an orientation flat 18F.

As shown in FIG. 1B, the silicon substrate 10s includes an outer edge region 10r. The outer edge region 10r is a region continuous with a side surface 10sf of the silicon substrate 10s. The outer edge region 10f is a region inclined with respect to the first surface 10F. The outer edge region 10r is, for example, an inclined polished region. As shown in FIG. 1, an inner region 10i is provided inside the outer edge region 10r.

As shown in FIG. 1A, the silicon substrate 10s includes multiple first regions 10R that can be distinguished from each other in an X-ray image of the wafer 110. The multiple first regions 10R are separated from the outer edge region 10r of the silicon substrate 10s. One of the multiple first regions 10R (region 10a) includes multiple first linear bodies 18a along a first line direction DL1. Another one (region 10b) of the multiple first regions 10R includes multiple second linear bodies 18b along a second line direction DL2. The second line direction DL2 crosses the first line direction DL1. Such multiple first regions 10R are provided in an inner region 10i.

Figure 2:
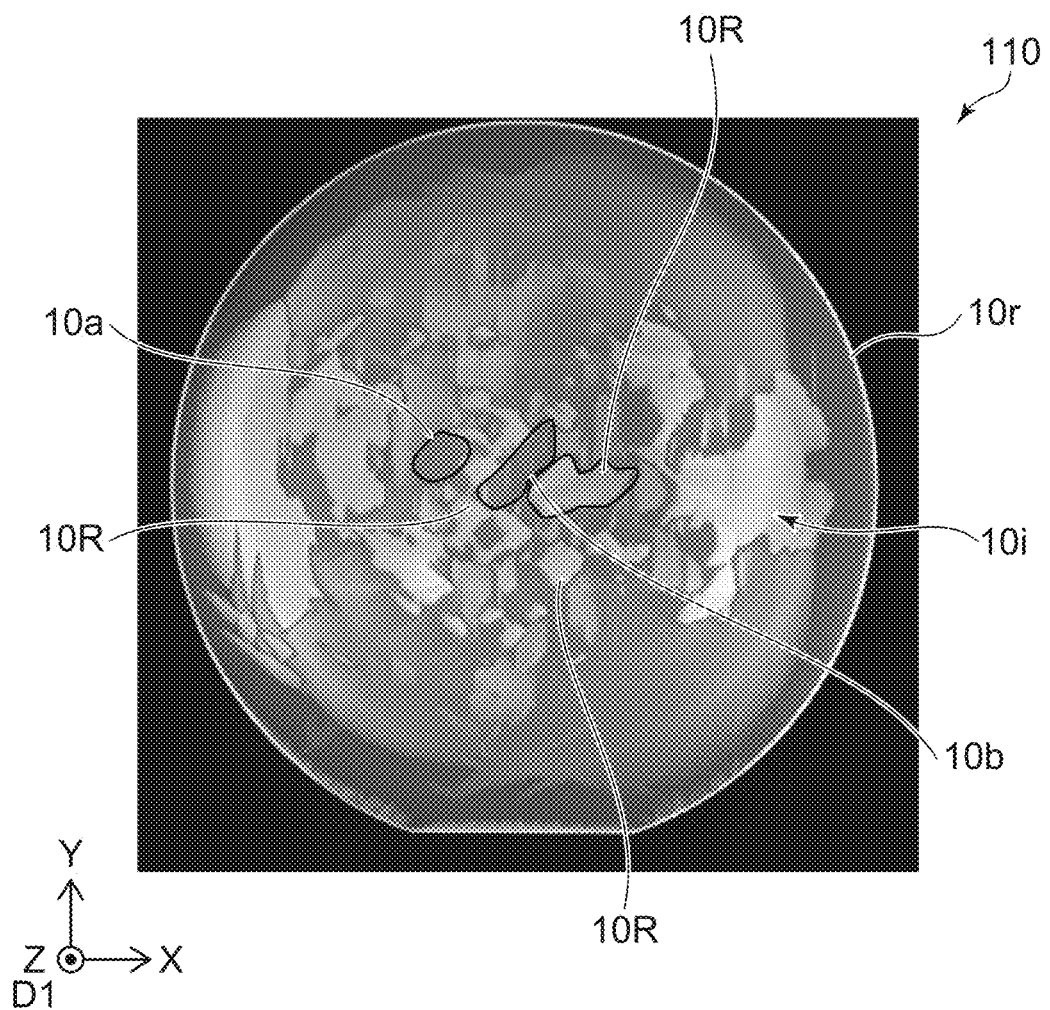
FIG. 2 is an X-ray image illustrating the wafer according to the first embodiment.

FIG. 2 is an X-ray image illustrating the wafer according to the first embodiment.

Figure 3:
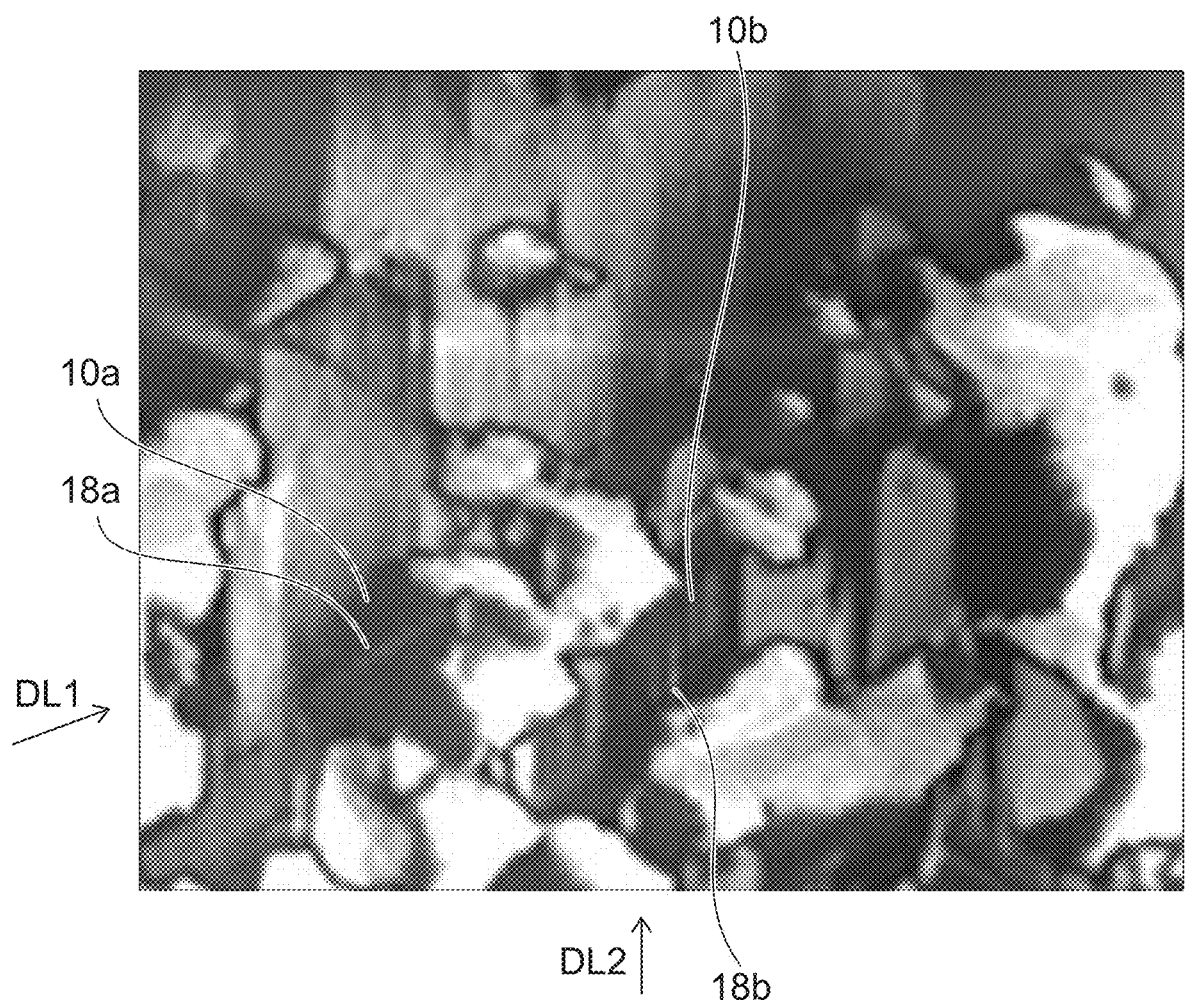
FIG. 3 is an X-ray image illustrating a part of the wafer according to the first embodiment.

FIG. 3 is an X-ray image illustrating a part of the wafer according to the first embodiment.

FIG. 3 is a magnified image of a part of FIG. 2. These figures schematically illustrate an X-ray image of the wafer 110. In the X-ray image of the wafer 110, different crystal states are observed depending on the brightness of the image and the like.

As shown in FIG. 2, the multiple first regions 10R are observed. The multiple first regions 10R can be distinguished from each other in the X-ray image of the wafer 110. Each of the multiple first regions 10R may be, for example, island-shaped. As shown in FIG. 3, one of the multiple first regions 10R (region 10a) includes multiple first linear bodies 18a along the first line direction DL1. Another one (region 10b) of the multiple first regions 10R includes multiple second linear bodies 18b along the second line direction DL2. The second line direction DL2 crosses the first line direction DL1.

It was found that such a configuration can suppress fracture of the wafer, for example.

As shown in FIG. 3, the second line direction DL2 crosses the first line direction DL1. The crossing of the line directions corresponds to the disagreement of the deviation directions of the crystal lattices in these regions. For example, the deviation direction of the crystal lattice of one of the multiple first regions 10R (region 10a) is different from the deviation direction of the crystal lattice of another one (region 10b) of the multiple first regions 10R.

For example, one of the multiple first regions 10R is island-shaped. Another one of the multiple first regions 10R is island-shaped.

Such a configuration occurs in the process of forming the nitride semiconductor layer 20 on the silicon substrate 10s. That is, in the silicon substrate 10s before forming the nitride semiconductor layer 20, the multiple first regions 10R as described above are not substantially observed. In the silicon substrate 10s before forming the nitride semiconductor layer 20, there is no deviation of the crystal lattice.

On the other hand, when the nitride semiconductor layer 20 is formed on the silicon substrate 10s, it is considered that plastic deformation occurs in at least a part of the silicon substrate 10s due to the stress generated between the nitride semiconductor layer 20 and the silicon substrate 10s. The plastic deformation that occurs in the silicon substrate 10s is observed in the X-ray image as a region where the crystal lattice is deviated. For example, the plastic deformation that occurs on the silicon substrate 10s is observed as the above-mentioned multiple first regions 10R in the X-ray image. The plastic deformation of the silicon substrate 10s alleviates the stress generated between the silicon substrate 10s and the nitride semiconductor layer 20. As a result, a high quality nitride semiconductor layer 20 can be stably obtained. For example, fracture of the wafer is suppressed. High yield can be obtained. High productivity can be obtained.

For example, when the nitride semiconductor layer 20 is thickly formed on the silicon substrate 10s, warp becomes large due to the generated stress. When the warp becomes excessively large and exceeds the limit of elastic deformation, for example, cracks occur in the nitride semiconductor layer 20. Further, even when cracks are not generated, if the stress becomes excessively large, the side surface 10sf (and the outer edge region 10r) of the silicon substrate 10s comes into contact with other members, and fractures are likely to occur from that portion. By relaxing the stress, cracks and fractures can be suppressed.

The inventor of the application has obtained the following findings based on the results of an experiment in which the conditions for forming the nitride semiconductor layer 20 on the silicon substrate 10s are changed. That is, cracks can be suppressed when the multiple first regions 10R described above occur on the silicon substrate 10s. It is considered that this is because the stress is appropriately relaxed by the multiple first regions 10R. Further, when the multiple first regions 10R described above occur on the silicon substrate 10s, fractures can be suppressed. The multiple first regions 10R are plastically deformed portions, and are considered to be regions in which the strength is low. Since the multiple first regions 10R are separated from the outer edge region 10r, strong strength can be maintained in the outer edge region 10r. As a result, it is considered that fractures can be suppressed even when the outer edge region 10r comes into contact with other members.

Figure 4:
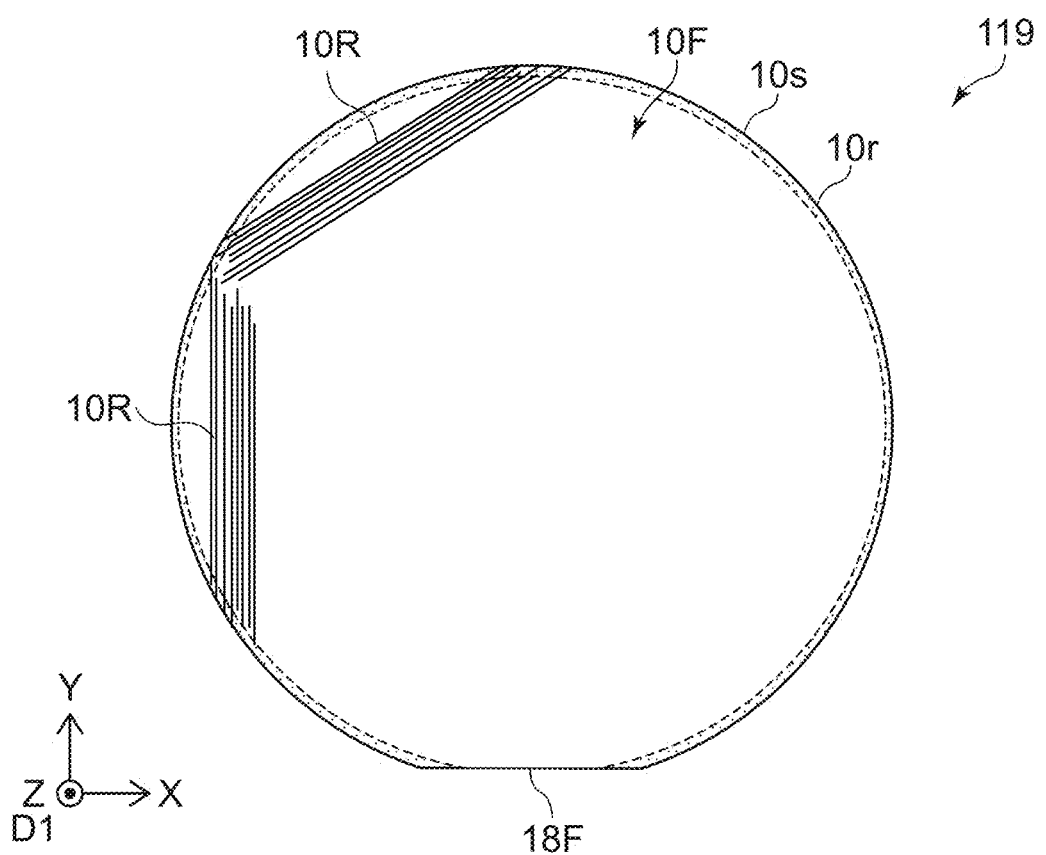
FIG. 4 is a schematic plan view illustrating a wafer according to a reference example.

FIG. 4 is a schematic plan view illustrating a wafer according to a reference example.

As shown in FIG. 4, in a wafer 119 of the reference example, the multiple first regions 10R are connected to the outer edge region 10r. In such a wafer 119, fractures are likely to occur. It is considered that fractures can be suppressed when the multiple first regions 10R are separated from the outer edge region 10r.

Figure 5:
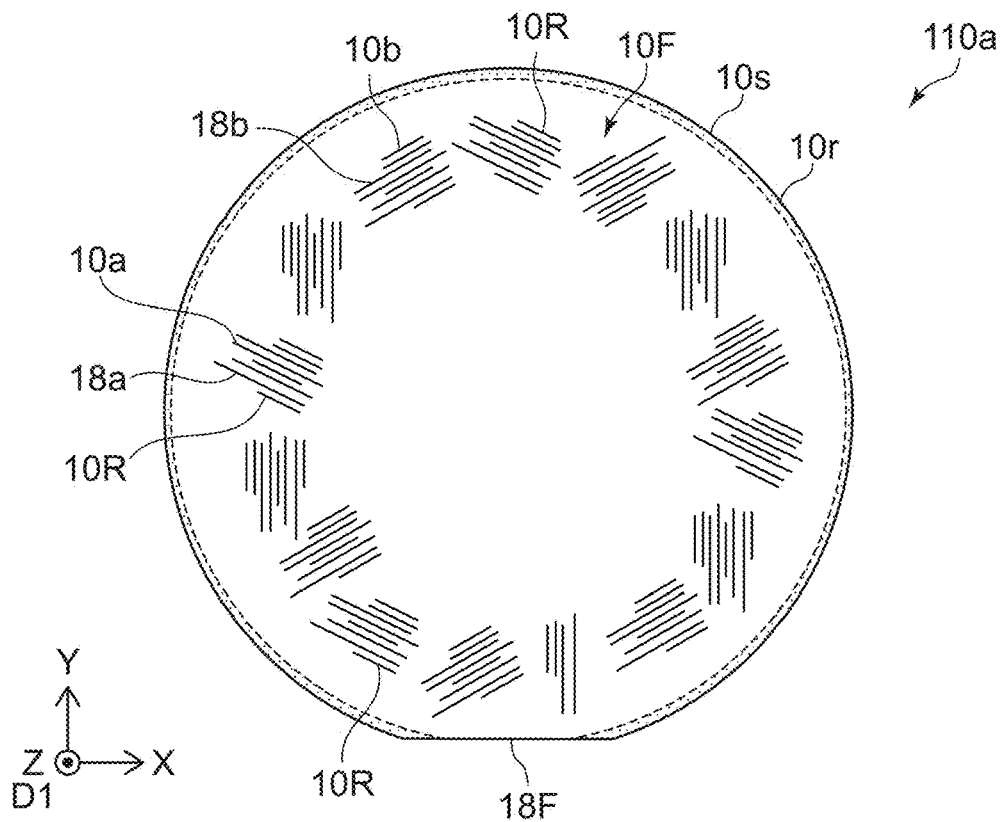
FIG. 5 is a schematic plan view illustrating a wafer according to the first embodiment.

FIG. 5 is a schematic plan view illustrating a wafer according to the first embodiment.

As shown in FIG. 5, in another wafer 110a according to the embodiment, the multiple first regions 10R are annular. Also in this case, the multiple first regions 10R are separated from the outer edge region 10r. Fractures can also be suppressed in the wafer 110a.

The above X-ray image is a transmission diffraction image of the wafer 110, and the X-ray image is, for example, a transmission diffraction image based on the orientation of silicon crystals included in the silicon substrate 10s. The X-ray image is, for example, a transmission diffraction image of the wafer 110 on the (422) plane of the silicon crystal included in the silicon substrate 10s. In this case, the obtained X-ray image reflects the state of crystals in the silicon substrate 10s. The diffraction image of the (422) plane of the silicon crystal included in the silicon substrate 10s does not substantially include information on the state of the crystal with respect to the nitride semiconductor layer 20.

The plane orientation of the silicon substrate 10s is, for example, (111). The X-ray image is obtained by an X-ray diffractometer. The diffraction plane may be the (422) plane. The X-ray may be Mo Kα ray. The imaging conditions of the X-ray image illustrated in FIG. 2 are as follows. The X-ray diffractometer is Rigaku Corporation's X-ray diffractometer XRT-300. X-rays are Mo Kα rays. The diffraction plane is the (422) plane. At the time of imaging, the conditions for obtaining a clear image were adjusted, and the following conditions were adopted. The tube voltage is 50 kV. The tube current is 280 mA. The entrance side slit width is 1 mm. The exit side slit width is 1 mm. The beam scanning speed is 1 mm/sec. The number of beam scans is two.

Figure 6:
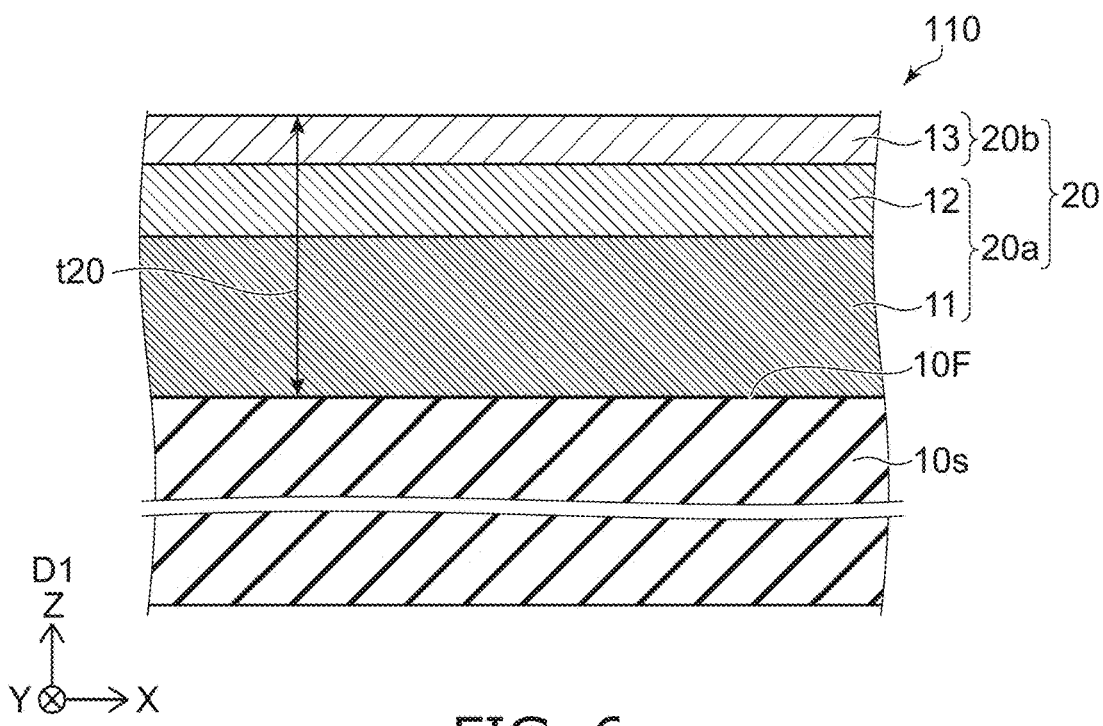
FIG. 6 is a schematic cross-sectional view illustrating the wafer according the first embodiment.

FIG. 6 is a schematic cross-sectional view illustrating the wafer according the first embodiment.

As shown in FIG. 6, the nitride semiconductor layer 20 may include, for example, a first nitride region 11, a second nitride region 12, and a third nitride region 13. The first nitride region 11 includes $Al_{x1}Ga_{1-x1}N$ ($0<x1<1$). The second nitride region 12 contains $Al_{x2}Ga_{1-x2}N$ ($0\leq x2<1$) and contains carbon. The third nitride region 13 includes $Al_{x3}Ga_{1-x3}N$ ($0\leq x3<1$). The first nitride region 11 is between the silicon substrate 10s and the third nitride region 13. The second nitride region 12 is between the first nitride region 11 and the third nitride region 13. The third nitride region 13 does not include carbon. Alternatively, a concentration of carbon in the third nitride region 13 is lower than a concentration of carbon in the second nitride region 12. The second nitride region is, for example, a GaN layer including carbon. The third nitride region 13 is, for example, a GaN layer substantially free of carbon. The composition ratio x2 may be lower than the composition ratio x1. The composition ratio x3 may be lower than the composition ratio x1. The composition ratio x3 may be substantially the same as the composition ratio x2.

The first nitride region 11 is formed on the silicon substrate 10s. The second nitride region 12 is formed on the first nitride region 11. The third nitride region 13 is formed on the second nitride region 12. By providing the second nitride region 12 including carbon, a dislocation density can be reduced in the third nitride region 13.

The second nitride region 12 including carbon is formed at a relatively low temperature. As a result, the second nitride region 12 can stably include carbon. The first nitride region 11 may also be formed at a relatively low temperature. On the other hand, the third nitride region 13 is formed at a relatively high temperature. As a result, high crystal quality can be obtained in the third nitride region 13.

The first nitride region 11 and the second nitride region 12 are included in a first nitride layer 20a. The third nitride region 13 is included in a second nitride layer 20b. The formation temperature of the first nitride layer 20a is lower than the formation temperature of the second nitride layer 20b. The first nitride layer 20a is a low temperature formation layer. The second nitride layer 20b is a high temperature formation layer.

For example, the formation of the first nitride layer 20a including the first nitride region 11 and the second nitride region 12 increases the stress applied to the silicon substrate 10s. Then, the second nitride layer 20b is formed at a high temperature, and at that time, a temperature distribution is generated in the plane. As a result, plastic deformation is caused in the inner region 10i, and the multiple first regions 10R are formed. As a result, fractures can be suppressed.

In the following, an example of the stress generated in the wafer will be described.

Figure 7:
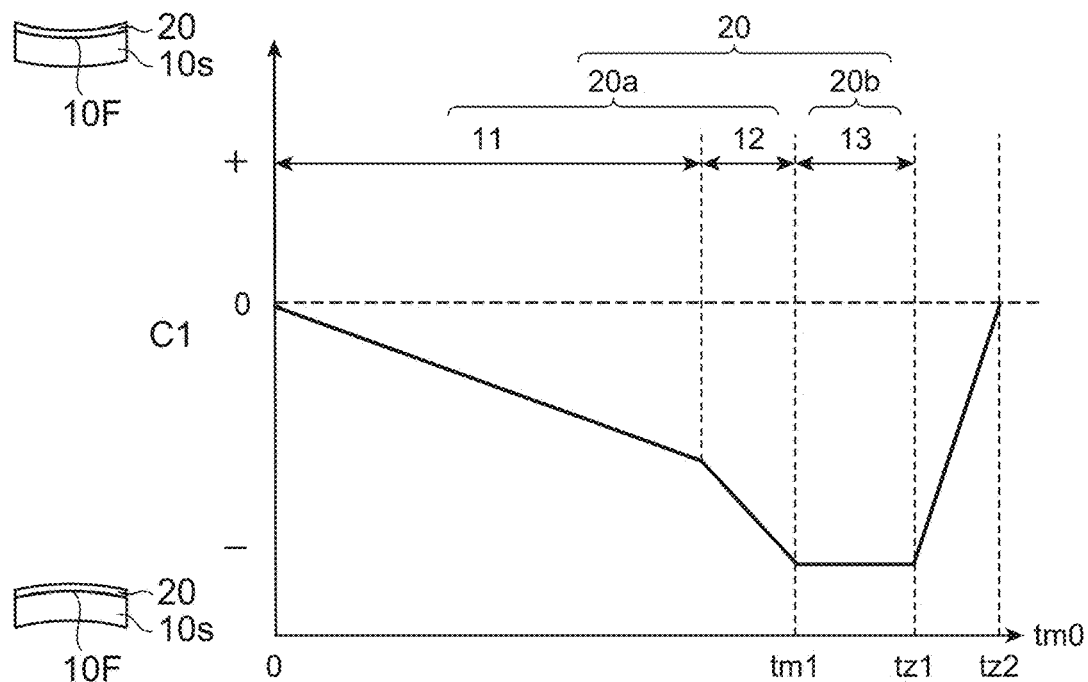
FIG. 7 is a graph illustrating characteristics of the wafer according the first embodiment.

FIG. 7 is a graph illustrating the characteristics of the wafer according to the first embodiment.

The horizontal axis of FIG. 7 is the time tm0 for forming the nitride semiconductor layer 20. As the time tm0 increases, a thickness t20 of the nitride semiconductor layer 20 (see FIG. 6) becomes thicker. The vertical axis of FIG. 3 is the curvature C1 of the warp of the wafer. When the curvature C1 is positive, the wafer warps in a concave shape. When the curvature C1 is negative, the wafer warps in a convex shape. In the concave warp, the central portion of the nitride semiconductor layer 20 is between the outer edges of the silicon substrate 10s. In the convex warp, the central portion of the silicon substrate 10s is between the outer edges of the nitride semiconductor layer 20.

The nitride semiconductor layer 20 is formed at a high temperature of not less than 800° C. when the time tm0 is 0 to time tz1. At time tz1, the formation of the nitride semiconductor layer 20 is completed, and the temperature drops. At time tz2, the temperature is, for example, substantially room temperature. At time tz2, when the curvature C1 is 0, the wafer is flat. At time tz2, when the curvature C1 is positive, the wafer warps concavely. In this case, tensile stress is generated in the nitride semiconductor layer 20. If the stress is high, the wafer will crack. On the other hand, even when the curvature is negative, if the absolute value of the curvature C1 is large, it is difficult to stably carry out various subsequent steps due to the warp of the wafer. Therefore, at time tz2, the curvature C1 is preferably substantially 0 or negative with a small absolute value. The curvature C1 may be positive with a small absolute value as long as the wafer is not cracked.

As shown in FIG. 7, in this example, when the time tm0 increases, the curvature C1 becomes negative and the absolute value of the curvature increases. For example, due to the formation of the first nitride region 11 and the second nitride region 12, compressive stress is accumulated and the wafer is deformed in a convex shape. Compressive stress is accumulated, and the plastic deformation of the silicon substrate 10s is likely to occur.

In the embodiment, the temperature of the inner region is made higher than the temperature of the outer edge region 10r at the timing at which plastic deformation is likely to occur (timing close to the limit of elastic deformation). As a result, plastic deformation is locally caused in the inner region 10i of the silicon substrate 10s. At this time, by raising the temperature of the entire wafer, plastic deformation is likely to occur in the inner region 10i of the silicon substrate 10s.

In this example, the third nitride region 13 is formed at a high temperature as the second nitride layer 20b at time tm1. At this time, the temperature of the inner region 10i is made higher than the temperature of the outer edge region 10r. As a result, plastic deformation can be locally occurred in the inner region 10i of the silicon substrate 10s.

By locally causing plastic deformation in the inner region 10i of the silicon substrate 10s, the change in curvature C1 during the formation of the third nitride region 13 is suppressed. At time tz2 of substantially room temperature, the curvature C1 of substantially zero is obtained.

In the embodiment, the thickness t20 (see FIG. 6) of the nitride semiconductor layer 20 is, for example, not less than 4 μm. As a result, in the semiconductor device manufactured of the wafer 110, the desired characteristics (for example, high breakdown voltage) can be easily obtained.

When the thickness t20 is not less than 4 μm, the stress for plastically deforming the silicon substrate 10s can be effectively obtained. When the thickness t20 is less than 4 μm, the accumulated stress is small. Therefore, cracks or fractures are unlikely to occur. When the thickness t20 is not less than 4 μm, the multiple first regions 10R described above are provided in the inner region 10i of the silicon substrate 10s, causing plastic deformation. As a result, fractures can be stably suppressed. The warp of the wafer can be reduced by plastic deformation. In the embodiment, the absolute value of the curvature C1 of the warp of the wafer 110 at room temperature (25° C.) is, for example, not more than 0.04/m. The absolute value of the curvature C1 of the warp of the wafer 110 at room temperature (25° C.) is preferably not more than 0.02/m, for example.

Figure 8:
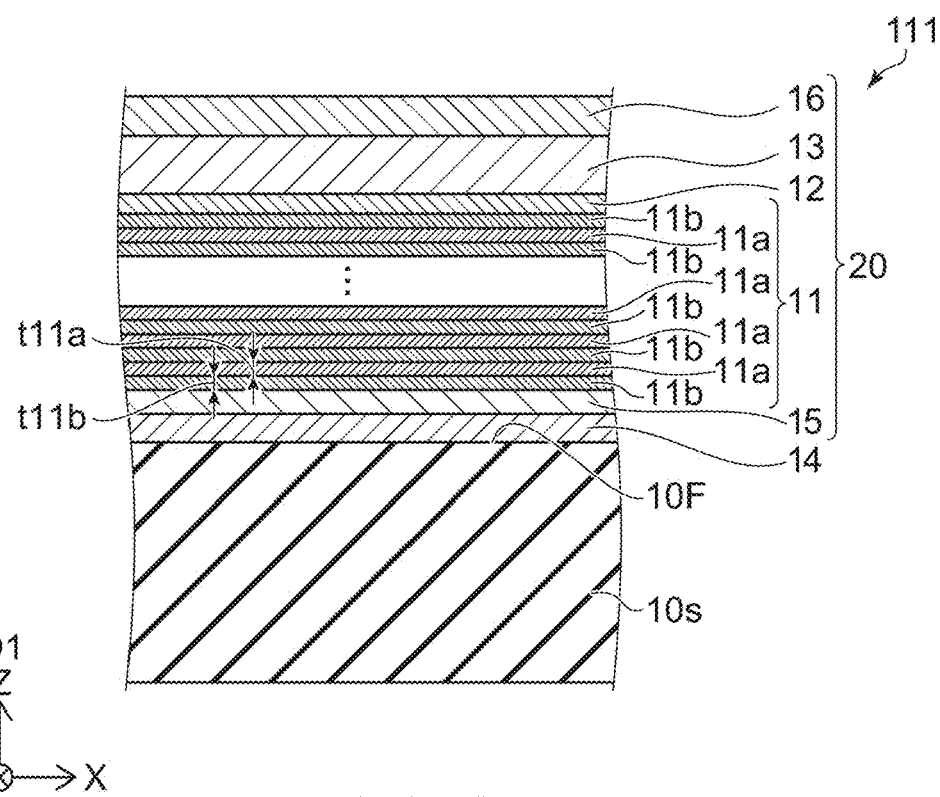
FIG. 8 is a schematic cross-sectional view illustrating a wafer according the first embodiment.

FIG. 8 is a schematic cross-sectional view illustrating a wafer according to the first embodiment.

As shown in FIG. 8, in a wafer 111 according to the embodiment, the nitride semiconductor layer 20 further includes a fourth nitride region 14. Other than this, the configuration of the wafer 111 may be the same as the configuration of the wafer 110.

The fourth nitride region 14 includes $Al_{x4}Ga_{1-x4}N$ ($0<x4\le1$). The fourth nitride region 14 is between the silicon substrate 10s and the first nitride region 11. The fourth nitride region 14 is, for example, an AlN layer. The fourth nitride region 14 is, for example, at least a part of a buffer layer.

As shown in FIG. 8, the nitride semiconductor layer 20 may further include a fifth nitride region 15. The fifth nitride region 15 includes $Al_{x5}Ga_{1-x5}N$ (0<x5<1, x5<x4). The fifth nitride region 15 is between the fourth nitride region 14 and the first nitride region 11. The fifth nitride region 15 is, for example, an AlGaN layer. In the fifth nitride region 15, the composition ratio x5 is, for example, not less than 0.05 and not more than 0.8. The fifth nitride region 15 is, for example, at least a part of the buffer layer.

As shown in FIG. 8, the first nitride region 11 may include multiple first films 11a and multiple second films 11b. The multiple first films 11a include $Al_{z1}Ga_{1-z1}N$ (0≤z1<1). The multiple second films 11b include $Al_{z2}Ga_{1-z2}N$ (0<z2≤1, z1<z2). The multiple first films 11a are, for example, a GaN layer or an AlGaN layer. The multiple second films 11b are, for example, an AlN layer.

In the first direction D1 perpendicular to the first surface 10F, one of the multiple first films 11a is between one of the multiple second films 11b and another of the multiple second films 11b. In the first direction D1, one of the multiple second films 11b is between one of the multiple first films 11a and another of the multiple first films 11a.

For example, the first film 11a and the second film 11b are alternately provided. In this example, one of the multiple second films 11b is in contact with the fifth nitride region 15. In this example, another one of the multiple second films 11b is in contact with the second nitride region 12. One of the multiple first films 11a and one of the multiple second films 11b may be in contact with the fifth nitride region 15. One of the multiple first films 11a and one of the multiple second films 11b may be in contact with the second nitride region 12. One thickness t11a of the multiple first films 11a is, for example, not less than 5 nm and not more than 100 nm. One thickness t11b of the multiple second films 11b is, for example, not less than 0.5 nm and not more than 20 nm.

As shown in FIG. 8, the nitride semiconductor layer 20 may further include a sixth nitride region 16. The sixth nitride region 16 includes $Al_{x6}Ga_{1-x6}N$ (0<x6<1, x3<x6). The third nitride region 13 is between the second nitride region 12 and the sixth nitride region 16. The sixth nitride region 16 is, for example, an AlGaN layer. For example, the third nitride region 13 includes a region facing the sixth nitride region 16. For example, a carrier region is formed in this region. The carrier region is, for example, a two-dimensional electron gas. The carrier region is used in the operation of the semiconductor device using the wafer 111.

Second Embodiment

The second embodiment relates to a semiconductor device. The semiconductor device according to the embodiment is manufactured from the wafer according to the first embodiment (for example, wafer 110 or wafer 111).

Figure 9:
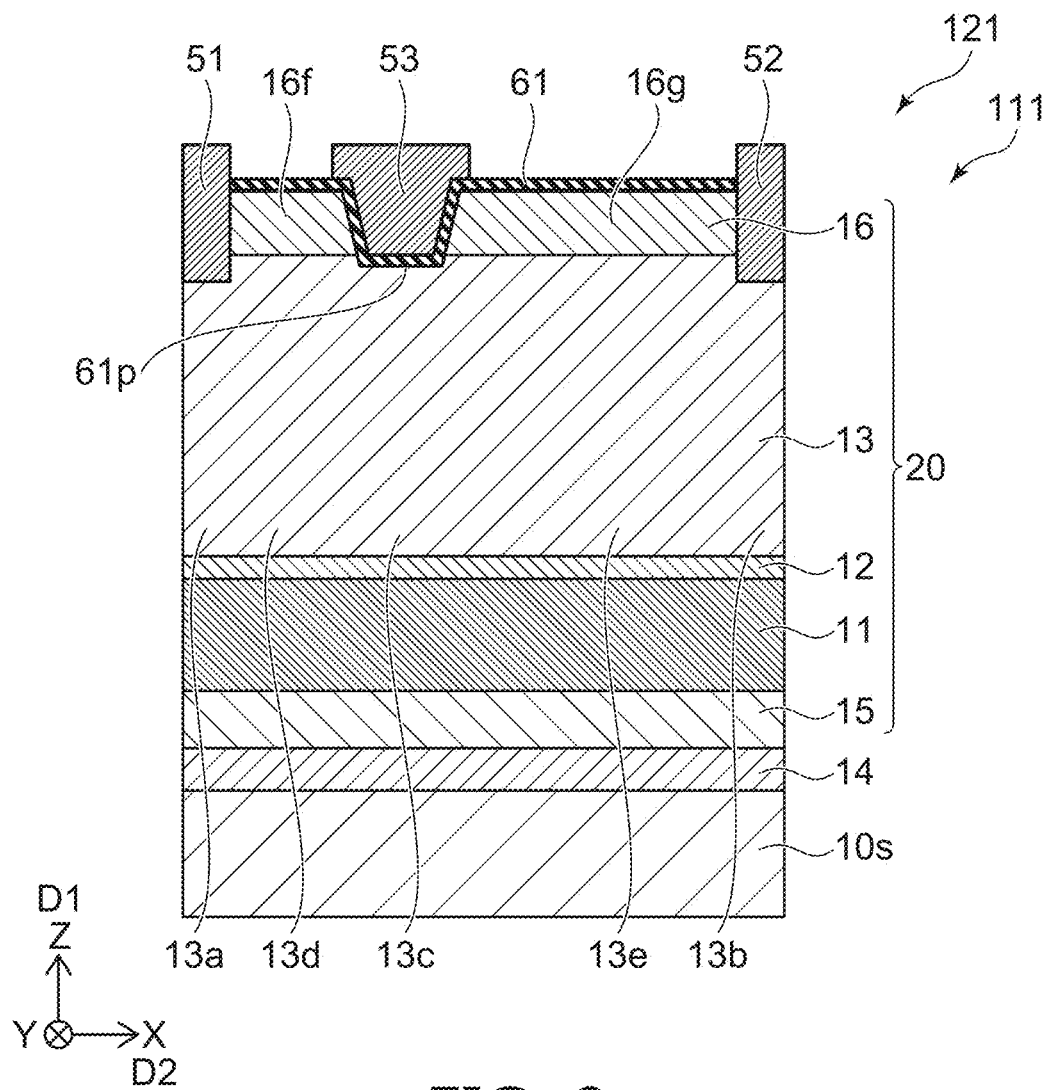
FIG. 9 is a schematic cross-sectional view illustrating a semiconductor device according to a second embodiment.

FIG. 9 is a schematic cross-sectional view illustrating a semiconductor device according to a second embodiment.

As shown in FIG. 9, a semiconductor device 121 according to the second embodiment includes a part of the wafer 111 according to the first embodiment, first to third electrodes 51 to 53, and an insulating member 61.

The direction from the first electrode 51 to the second electrode 52 is along the second direction D2. The second direction D2 crosses the first direction D1. The second direction D2 is, for example, the X-axis direction.

A position of the third electrode 53 in the second direction D2 is between a position of the first electrode 51 in the second direction D2 and a position of the second electrode 52 in the second direction D2.

The third nitride region 13 includes a first partial region 13a, a second partial region 13b, a third partial region 13c, a fourth partial region 13d, and a fifth partial region 13e. A direction from the first partial region 13a to the first electrode 51 is along the first direction D1. A direction from the second partial region 13b to the second electrode 52 is along the first direction D1. A position of the third partial region 13c in the second direction D2 is between a position of the first partial region 13a in the second direction D2 and a position of the second partial region 13b in the second direction D2. A direction from the third partial region 13c to the third electrode 53 is along the first direction D1. The fourth partial region 13d is between the first partial region 13a and the third partial region 13c in the second direction D2. The fifth partial region 13e is between the third partial region 13c and the second partial region 13b in the second direction D2.

The sixth nitride region 16 includes a sixth partial region 16f and a seventh partial region 16g. A direction from the fourth partial region 13d to the sixth partial region 16f is along the first direction D1. A direction from the fifth partial region 13e to the seventh partial region 16g is along the first direction D1. The insulating member 61 includes a first insulating region 61p. At least a part of the first insulating region 61p is provided between the third partial region 13c and the third electrode 53 in the first direction D1.

A current flowing between the first electrode 51 and the second electrode 52 can be controlled by a potential of the third electrode 53. The potential of the third electrode 53 may be, for example, a potential based on a potential of the first electrode 51.

The first electrode 51 functions as, for example, a source electrode. The second electrode 52 functions as, for example, a drain electrode. The third electrode 53 functions as, for example, a gate electrode. The first insulating region 61p functions as, for example, a gate insulating film. The semiconductor device 121 is, for example, a transistor.

As described above, the third nitride region 13 includes a region facing the sixth nitride region 16. A carrier region (for example, a two-dimensional electron gas) is formed in this region. The semiconductor device 121 is, for example, HEMT (High Electron Mobility Transistor).

In this example, at least a part of the third electrode 53 is between the sixth partial region 16f and the seventh partial region 16g. The semiconductor device 121 is, for example, a normally-off type transistor.

Figure 10:
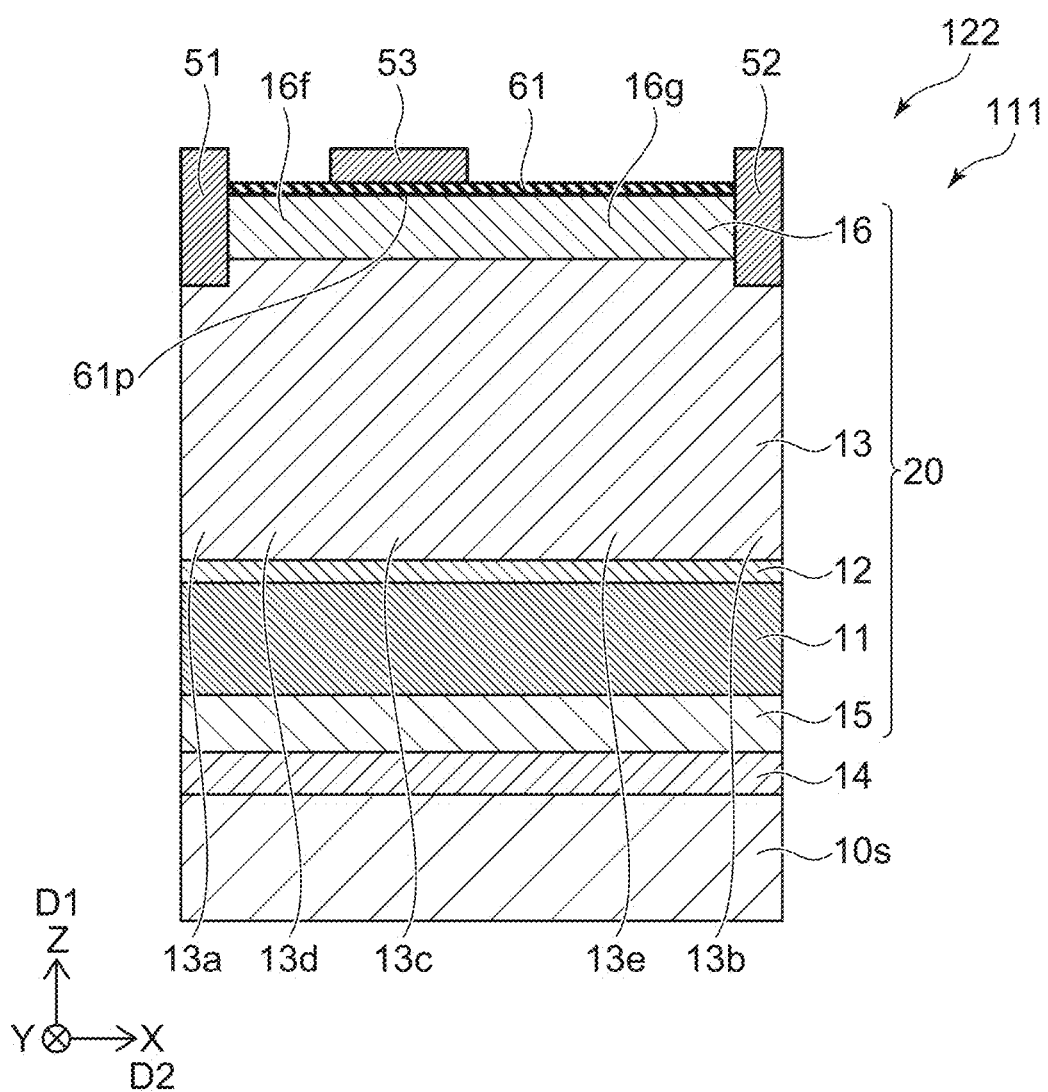
FIG. 10 is a schematic cross-sectional view illustrating a semiconductor device according to the second embodiment.

FIG. 10 is a schematic cross-sectional view illustrating a semiconductor device according to the second embodiment.

As shown in FIG. 10, in a semiconductor device 122 according to the embodiment, the third electrode 53 does not overlap the sixth nitride region 16 in the second direction D2. Except for this, the configuration of the semiconductor device 122 may be the same as the configuration of the semiconductor device 121. The semiconductor device 122 is, for example, a normally-on type transistor.

The first electrode 51 includes, for example, at least one selected from the group consisting of aluminum, titanium, nickel, and gold. The second electrode 52 includes, for example, at least one selected from the group consisting of aluminum, titanium, nickel, and gold. The third electrode 53 includes, for example, at least one selected from the group consisting of TiN, WN, Ni, Au, Pt and Ti. The third electrode 53 may include, for example, conductive silicon or polysilicon. The insulating member 61 includes, for example, an element including at least one selected from the group consisting of silicon, aluminum and hafnium, and an element including at least one selected from the group consisting of oxygen and nitrogen. The insulating member 61 includes, for example, silicon oxide and the like.

Third Embodiment

Figure 11:
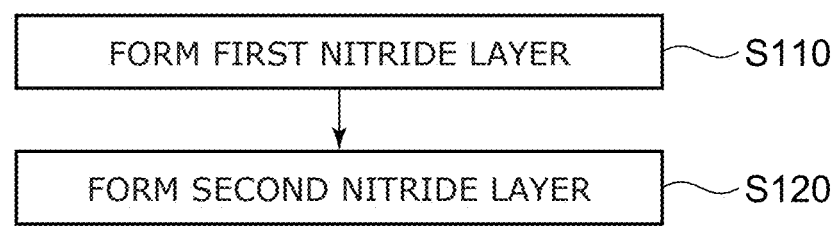
FIG. 11 is a flow chart illustrating a method for manufacturing the wafer according to a third embodiment.

FIG. 11 is a flowchart illustrating a method for manufacturing the wafer according to a third embodiment.

As shown in FIG. 11, the method for manufacturing the wafer according to the embodiment includes forming the first nitride layer 20a (see FIG. 6) (step S110). As described with respect to FIG. 6, the first nitride layer 20a is formed on the silicon substrate 10s including the first surface 10F. The first nitride layer 20a includes $Al_{a1}Ga_{1-a1}N$ ($0 \leq a1 \leq 1$).

As shown in FIG. 11, the manufacturing method includes forming the second nitride layer 20b on the first nitride layer 20a (step S120). The second nitride layer 20b includes $Al_{a2}Ga_{1-a2}N$ ($0 \leq a2 \leq 1$).

In the formation of the second nitride layer 20b, the first surface 10F is convexly aligned upward. The central portion of the first surface 10F is between the outer edges of the first nitride layer 20a.

As shown in FIG. 6, a direction from the silicon substrate 10s to the first nitride layer 20a corresponds to the first direction D1. In the formation of the second nitride layer 20b, a temperature of the inner region 10i including the center of the first surface 10F in the first direction D1 is higher than a temperature of the outer edge region 10r around the inner region 10i on the first surface 10F.

A difference between the temperature of the inner region 10i and the temperature of the outer edge region 10r is, for example, not less than 3° C. and not more than 15° C. Due to such a difference in temperature, plastic deformation is likely to occur in the inner region 10i. The degree of plastic deformation in the outer edge region 10r is smaller than the degree of plastic deformation in the inner region 10i. By such plastic deformation, for example, fracture can be suppressed.

In the embodiment, a second temperature in the formation of the second nitride layer 20b is higher than a first temperature in the formation of the first nitride layer 20a. A difference between the first temperature and the second temperature is, for example, not less than 50° C. and not more than 200° C. The first temperature is, for example, not less than 850° C. and less than 1000° C. The second temperature is, for example, not less than 1000° C. and not more than 1150° C.

Information on the concentration or composition of an element can be obtained by, for example, SIMS (Secondary Ion Mass Spectrometry) or EDX (Energy dispersive X-ray spectroscopy). Information on the thickness can be obtained by observation with an electron microscope or the like.

According to the embodiment, it is possible to provide a wafer, a semiconductor device, and a method for manufacturing a wafer, which can improve productivity.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in wafers such as substrates, nitride semiconductor layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all wafers, semiconductor devices, and methods for manufacturing wafers practicable by an appropriate design modification by one skilled in the art based on the wafers, the semiconductor devices, and the methods for manufacturing semiconductor wafers described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A wafer, comprising:
   a silicon substrate including a first surface; and
   a nitride semiconductor layer provided on the first surface,
   the silicon substrate including a plurality of first regions that can be distinguished from each other in an X-ray image of the wafer,
   the plurality of first regions being separated from an outer edge region of the silicon substrate,
   one of the plurality of first regions including a plurality of first linear bodies linearly extending along a first line direction, the first line direction corresponding to a first deviation direction of a crystal lattice of the one of the first regions,
   an other one of the plurality of first regions including a plurality of second linear bodies along a second line direction, the second line direction corresponding to a second deviation direction of a crystal lattice of the other one of the first regions, and
   the second line direction crossing the first line direction.

2. The wafer according to claim 1, wherein
   a deviation direction of a crystal lattice of one of the plurality of first regions is different from a deviation direction of a crystal lattice of the other one of the plurality of first regions.

3. The wafer according to claim 1, wherein
   the one of the plurality of first regions is island-shaped, and
   the other one of the plurality of first regions is island-shaped.

4. The wafer according to claim 1, wherein
a thickness of the nitride semiconductor layer is not less than 4 m, and
an absolute value of a curvature of warp of the wafer at 25° C. is not more than 0.04/m.

5. The wafer according to claim 1, wherein
a thickness of the nitride semiconductor layer is not less than 4 μm, and
an absolute value of a curvature of warp of the wafer at 25° C. is not more than 0.02/m.

6. The wafer according to claim 1, wherein
the nitride semiconductor layer includes
a first nitride region including $Al_{x1}Ga_{1-x2}N$ ($0<x1<1$),
a second nitride region including $Al_{x2}Ga_{1-x2}N$ ($0\leq x2<1$) and including carbon, and
a third nitride region including $Al_{x3}Ga_{1-x3}N$ ($0\leq x3<1$),
the first nitride region is between the silicon substrate and the third nitride region,
the second nitride region is between the first nitride region and the third nitride region, and
the third nitride region does not include carbon, alternatively a concentration of carbon in the third nitride region is lower than a concentration of carbon in the second nitride region.

7. The wafer according to claim 6, wherein
the nitride semiconductor layer further includes a fourth nitride region including $Al_{x4}Ga_{1-x4}N$ ($0<x4\leq 1$), and
the fourth nitride region is between the silicon substrate and the first nitride region.

8. The wafer according to claim 7, wherein
the nitride semiconductor layer further includes a fifth nitride region including $Al_{x5}Ga_{1-x5}N$ ($0<x5<1$, $x5<x4$), and
the fifth nitride region is between the fourth nitride region and the first nitride region.

9. The wafer according to claim 6, wherein
the first nitride region includes
a plurality of first films including $Al_{z1}Ga_{1-z1}N$ ($0\leq z1<1$), and
a plurality of second films including $Al_{z2}Ga_{1-z2}N$ ($0<z2\leq 1$, $z1<z2$),
one of the first films is between one of the second films and an other one of the second films in a first direction perpendicular to the first surface, and
the one of the second films is between the one of the first films and the other one of the first films in the first direction.

10. The wafer according to claim 6, wherein
the nitride semiconductor layer further includes a sixth nitride region including $Al_{x6}Ga_{1-x6}N$ ($0<x6<1$, $x3<x6$), and
the third nitride region is between the second nitride region and the sixth nitride region.

11. The wafer according to claim 1, wherein
the X-ray image is a transmission diffraction image based on an orientation of a plane of a silicon crystal included in the silicon substrate.

12. The wafer according to claim 1, wherein
the X-ray image is a transmission diffraction image of the wafer on a (422) plane of a silicon crystal included in the silicon substrate.

13. A semiconductor device, the device manufactured using the wafer according to claim 1.

14. The wafer according to claim 1, wherein
one of the plurality of first linear bodies corresponds to a deviation direction of a crystal lattice of the one of the plurality of first regions.

\* \* \* \* \*